United States Patent [19]

Macbeth

[11] Patent Number: 5,023,489
[45] Date of Patent: Jun. 11, 1991

[54] INTEGRATOR CIRCUIT

[75] Inventor: Ian C. Macbeth, Crawley, England

[73] Assignee: U.S. Philips Corporation, New York, N.Y.

[21] Appl. No.: 520,696

[22] Filed: May 8, 1990

[30] Foreign Application Priority Data

May 10, 1989 [GB] United Kingdom ............ 8910756.9

[51] Int. Cl.$^5$ ................................................ G05F 3/24
[52] U.S. Cl. ................................. 307/490; 307/353; 323/316
[58] Field of Search ................ 307/40, 353; 365/182, 365/183; 328/151, 127; 323/315, 316, 317

[56] References Cited

U.S. PATENT DOCUMENTS

| 4,864,217 | 9/1989 | Bird | 323/316 |
| 4,866,368 | 9/1989 | Bird | 323/316 |
| 4,897,596 | 1/1990 | Hughes | 323/315 |

Primary Examiner—Stanley D. Miller
Assistant Examiner—Scott A. Ouellette
Attorney, Agent, or Firm—Bernard Franzblau

[57] ABSTRACT

An integrator circuit which uses switched current techniques and includes a first current memory cell (T31, T32, S31, C31) a second current memory cell (T33, T34, C32, S32, T35) and a third (correcting) current memory cell (T36, S33, C33). An input current signal is fed to input (30) and a switch (S30) is closed during the φ portion of each sampling period, as is the switch (S31) in the first current memory cell. The other switches (S32, S33) are closed during the φ portion of each sampling period. During the φ portion transistor (T31) acts as a current source producing the current applied to it in the preceding φ portion. This is subtracted from the current produced by the output of the second current memory cell (T34) and the difference is stored in the third current memory cell (T36, S33, C33). During the next φ portion transistor (T36) acts a current source correcting the feedback current fed to the input (T31) of the first current memory cell. This reduces the sensitivity of the integrator to device matching.

24 Claims, 5 Drawing Sheets

INTEGRATOR CIRCUIT

BACKGROUND OF THE INVENTION

This invention relates to an integrator circuit for integrating an input signal in the form of a sampled analog current, the integrator comprising input means for receiving the input signal, output means for producing as an output signal the integrated input signal, a current memory cell for producing at its output during a first portion of each sampling period a current related to that applied to its input during a second portion of that or a preceding sampling period, means for coupling the output of the current memory cell to the integrator output means, and feedback means for applying a feedback signal to the input of the current memory cell during the second portion of each sampling period.

An integrator circuit as set forth in the preceding paragraph has been disclosed in a paper by J. B. Hughes, N. C. Bird, and I. C. Macbeth entitled "Switched Currents—A New Technique for Analogue Sampled-Data Signal Processing" which was presented to The Institution of Electrical Engineers on 17th Feb. 1989.

Figure 1:
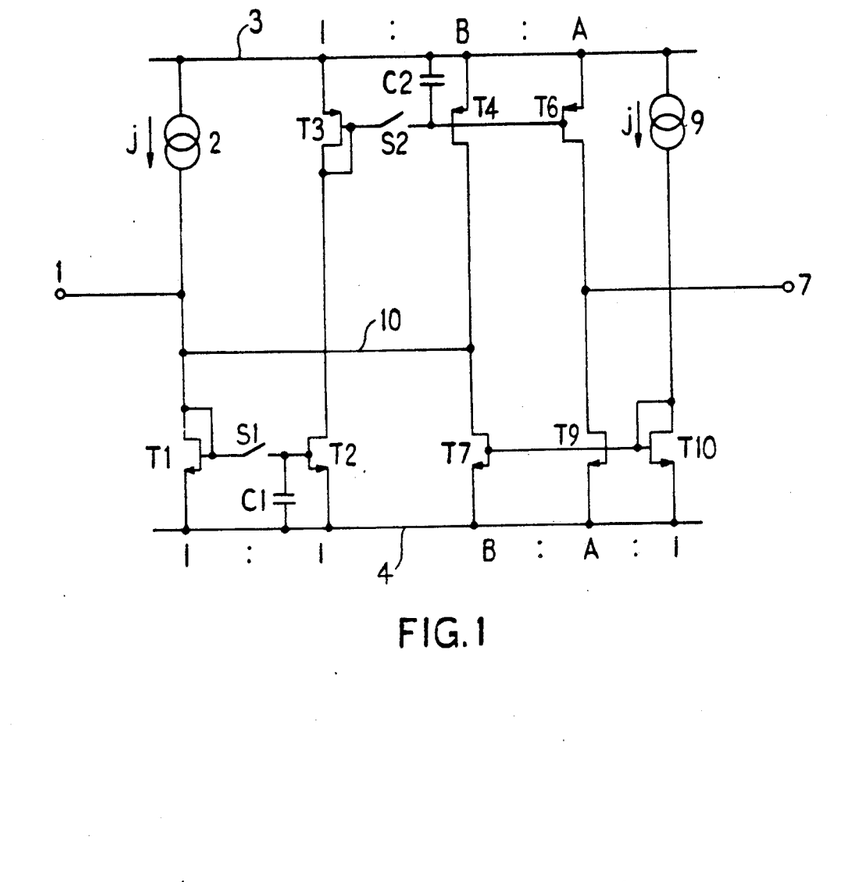
FIG. 1 is a circuit diagram of an integrator circuit as disclosed in UK Patent Application No. 8816072.6 which corresponds to U.S. Pat. No. 4,958,123 (9/18/90)
Figure 2:
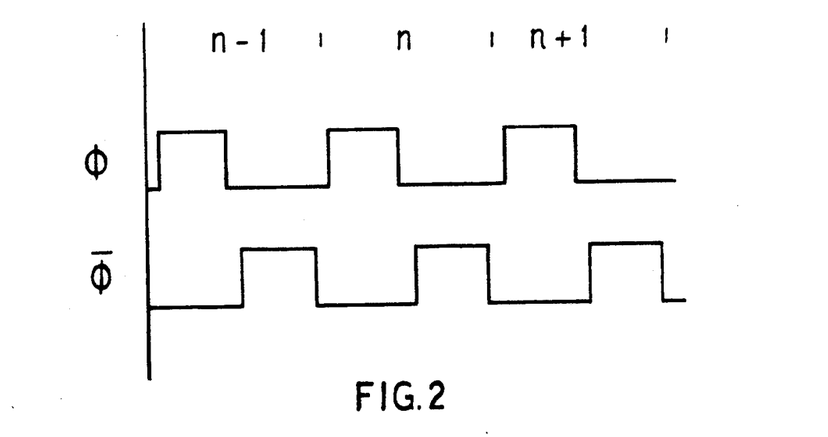
FIG. 2 is a timing diagram showing clock waveforms used for operating switches in the integrator circuits described herein.

FIG. 1 illustrates an integrator circuit as set forth in the opening paragraph while FIG. 2 shows the clock waveforms used to operate the switches in the circuit of FIG. 1.

The integrator circuit shown in FIG. 1 has an input 1 which is connected to the junction of a current source 2 and the drain electrode of an n-channel field effect transistor T1. The other end of the current source 2 is connected to a positive supply rail 3 while the source electrode of transistor T1 is connected to a negative supply rail 4. The drain electrode of transistor T1 is connected to its gate electrode and to one end of a switch S1. The other end of the switch S1 is connected to the junction of a capacitor C1 and the gate electrode of an n-channel field effect transistor T2. The source electrode of transistor T2 and the other end of the capacitor C1 are connected to the negative supply rail 4. The drain electrode of transistor T2 is connected to the drain electrode of a p-channel field effect transistor T3 whose source electrode is connected to the positive supply rail 3. The drain electrode of transistor T3 is connected to its gate electrode and to one end of a switch S2. The other end of the switch S2 is connected to the junction of the gate electrode of a p-channel field effect transistor T4 and a capacitor C2. The source electrode of transistor T4 and the other end of capacitor C2 are connected to the positive supply rail 3. The gate electrode of transistor T4 is further connected to the gate electrode of a p-channel field effect transistor T6 whose source electrode is connected to the positive supply rail 3. The drain electrode of transistor T4 is connected to the drain electrode of an n-channel field effect transistor T7 whose source electrode is connected to the negative supply rail 4. The drain of transistor T4 is connected via a feedback connection 10 to the drain electrode of transistor T1. A current source 9 is connected between the positive supply rail 3 and the drain electrode of an n-channel field effect transistor T10 whose source electrode is connected to the negative supply rail 4. The drain electrode of transistor T10 is connected to its gate electrode, to the gate electrode of transistor T7, and to the gate electrode of an n-channel field effect transistor T9. The source electrode of transistor T9 is connected to the negative supply rail 4 while its drain electrode is connected to the drain electrode of transistor T6 and to an output terminal 7.

The operation of the circuit shown in FIG. 1 is as follows. Input 1 is fed by a current i which is a sampled current and remains substantially constant during each sampling period and changes in successive sampling periods to follow the continuous analogue signal from which it is derived. A feedback current $i_f$ which is the difference between the currents produced by transistors T4 and T7, is produced in the feedback path 10 while an output current $i_o$, which is the difference between the currents produced by transistors T6 and T9, is produced at the output 7. The current sources 2 and 9 each produce a bias current j. The ratios of the currents conducted by transistors T3, T4 and T6 are arranged to be 1:B:A, while the ratios of the currents conducted by transistors T10, T9 and T7 are arranged to be 1:A:B. Switch S1 is arranged to be closed during a portion $\phi$ of each sampling period while switch S2 is arranged to be closed during a non-overlapping portion $\bar{\phi}$ of each sampling period.

During the $\phi$ part sampling period (n−1), see FIG. 2, the current i(n−1) is applied to input 1 and this current together with the bias current j produced by current source 2 and a feedback current $i_f$ on line 10 is applied to the input of the first memory cell. As a result a current $I_2$ is produced by transistor T2 which can be derived from the equation $$I_2 = i(n-1) + j + i_f$$
$$\text{where } i_f = i_o(n-1) B/A$$
$$\text{i.e., } I_2 = i(n-1) + j + i_o(n-1) B/A.$$

During the $\bar{\phi}$ portion of sampling period n the switch S1 is open but the current $I_2$ is maintained at its previous value by the charge on capacitor C1. Consequently the current $I_2 = i(n-1) + j + i_o(n-1) B/A$ is fed to the input of the second memory cell and as switch S2 is closed a current $I_4$ is produced by transistor T4 and a current $I_6$ is produced by transistor T6. The current $I_4$ is equal to $BI_2$ while the current $I_6$ is equal to $AI_2$. Consequently the current $I_6$ during the sampling period n is given by the expression $$I_6(n) = A[i(n-1) + j + i_o(n-1)B/A].$$

The current $i_o(n)$ is given by $I_6(n) - Aj$. Consequently $$i_o(n) = A\, i(n-1) + Aj + A\, i_o(n-1) B/A - Aj$$
$$= A\, i(n-1) + B\, i_o(n-1).$$

Converting to the z-domain:

$$i_o(z) = A\, i(z)z^{-1} + B\, i_o(z)z^{-1}$$

therefore $$H(z) = \frac{i_o(z)}{i(z)} = \frac{Az^{-1}}{1 - Bz^{-1}}$$

The continuous time lossy integrator is described by $$H(s) = \pm \frac{1}{a + s\tau}$$

Using the forward Euler transform $$s \to \frac{1}{T} \cdot \frac{1 - z^{-1}}{z^{-1}}$$

$$H(z) = \pm \frac{T}{\tau} \cdot \frac{z^{-1}}{1 - \frac{\tau - a T}{\tau} z^{-1}}$$

i.e. $A = T/\tau$ and $B = \frac{\tau - aT}{\tau}$.

Thus B=1 corresponds to a=0 and gives lossless integration. The integrator shown in FIG. 1 can be modified to perform according to the backward Euler transform by connecting the input 1 to the drain electrode of transistor T2 instead of to the drain electrode of transistor T1.

This integrator circuit which is disclosed in FIG. 20 of the co-pending UK patent application No. 8816072.6, which corresponds to U.S. Pat. No. 4,958,123 (9/18/90), has certain disadvantages. For proper operation it relies on the feedback current $i_f$ being an exact replica of the current applied to the drain electrode of transistor T1 in the preceding sample period (minus the bias current j). However, the accuracy of this feedback current can be impaired by a number of factors. First, if the gain of the feedback loop becomes greater than unity the system becomes unstable. Conversely, if the gain is less than unity the integrator becomes lossy, that is the inverter becomes a first order low pass filter whose cut off frequency becomes highly sensitive to small changes in the gain if the cut off frequency is much less than the clock frequency. The gain of the feedback loop is in turn directly determined by the matching between transistors T1 and T2 and between transistors T3 and T4. Secondly, the switches S1 and S2 introduce clock feedthrough which distorts the signal and accumulates in the integrator causing d.c. offsets at the output of the integrator. Thirdly, for each of the current memory cells there is a time constant set up due to the 1/gm of the diode connected transistor, the 'on-resistance' of the switch, and the gate capacitance (and additional capacitance if provided) of the output transistor. This filters the signal in the non-linear voltage domain and causes signal distortion. Furthermore, a delay determined by this time constant and the frequency of the sampled signal changes the effective value of the unit delay $z^{-1}$ which corrupts the filter characteristics.

SUMMARY OF THE INVENTION

It is an object of the invention provide an integrator circuit in which the effects of one or more of these disadvantages is/are mitigated.

The invention provides an integrator circuit as set forth in the opening paragraph characterised in that the feedback means comprises means for determining, during the first portion of each sampling period, the signal current applied to the current memory cell, and means for applying a feedback current, which is dependent on the determined current, to the input of the current memory cell during the second portion of each sampling period.

The invention is based on forcing a delayed feedback signal current to assume a known value rather than relying on device matching in current mirror or current memory circuits to produce a correct value of feedback current. Thus, the magnitude of the feedback signal can be made insensitive to device matching thereby reducing the sensitivity of high Q integrators, fabricated using switched current techniques, to device mismatches.

The current memory cell may comprise a field effect transistor having a switch connected between its drain and gate electrodes, the switch being closed only during the second portion of each sampling period. An additional capacitor may be connected between the gate and source electrodes of the transistor.

By constructing the current memory cell in this way, when the switch is opened the transistor acts as a current source producing the same current as was fed to it when the switch was closed. Since the same transistor is used there will be no device mismatch and hence the current produced during the first portion of a sampling period will be equal to the current applied during the previous second portion of a sampling period (neglecting any clock feedthrough from the switch or charge leakage from the capacitor or gate/source capacitance).

The means for coupling the output of the current memory cell to the output means of the integrator circuit may comprise a further current memory cell.

This provides a convenient arrangement which enables the time when the output is valid within each sampling period to be determined.

The means for applying the feedback current may comprise means for coupling an output of the second current memory cell to the input of the first current memory cell during the second portion of each sampling period.

The output of the second current memory cell will, provided that the correct current ratios are chosen, be of approximately the correct value for the feedback signal and can provide the bulk of the feedback signal.

The input of a third current memory cell may be coupled to the input of the first current memory cell, the third current memory cell receiving, during the first portion of each sampling period, the difference between the current produced at the input of the first current memory cell and that produced at the output of the second current memory cell, and supplying that current to the input of the first current memory cell during the second part of each sampling period.

The third current memory cell corrects the output of the second current memory cell in the feedback path so that the correct feedback signal is applied even when device mismatch is present.

The second current memory cell may have a further output which supplies a scaled version of the current at the first output during the first portion of each sampling period and applies it to the input of the third current memory cell.

This enables a lossy integrator to be formed since the third current memory cell will now overcorrect the feedback signal causing only a proportion (dependent on the scaling factor of the further output) of the output current to be fed back to the input.

The integrator may further comprise means for adding a bias current to the input signal and means for subtracting a suitably scaled bias current from the feedback and output signals so that bi-directional input currents can be integrated and bi-directional output currents produced.

This enables the integrator to be formed as a self contained module within a switched current system and to receive and produce bi-directional input and output currents while processing within the module only unidirectional currents so that the input diodes of the current memory and current mirror circuits are not reverse biassed.

The integrator circuit may be arranged so that signal currents are conducted only by field effect transistors having one polarity and may be arranged so that only n-channel field effect transistors conduct signal currents.

As disclosed in our co-pending application No. 8828667.9, which corresponds to U.S. Pat. application Ser. No. 446,821 filed 12/6/89, the contents of which are hereby incorporated by reference, this allows lower supply rail voltages to be used for a given circuit performance.

BRIEF DESCRIPTION OF THE DRAWINGS

Embodiments of the invention will now be described, by way of example, with reference to the accompanying drawings, in which.

DESCRIPTION OF THE PREFERRED EMBODIMENTS

Figure 3:
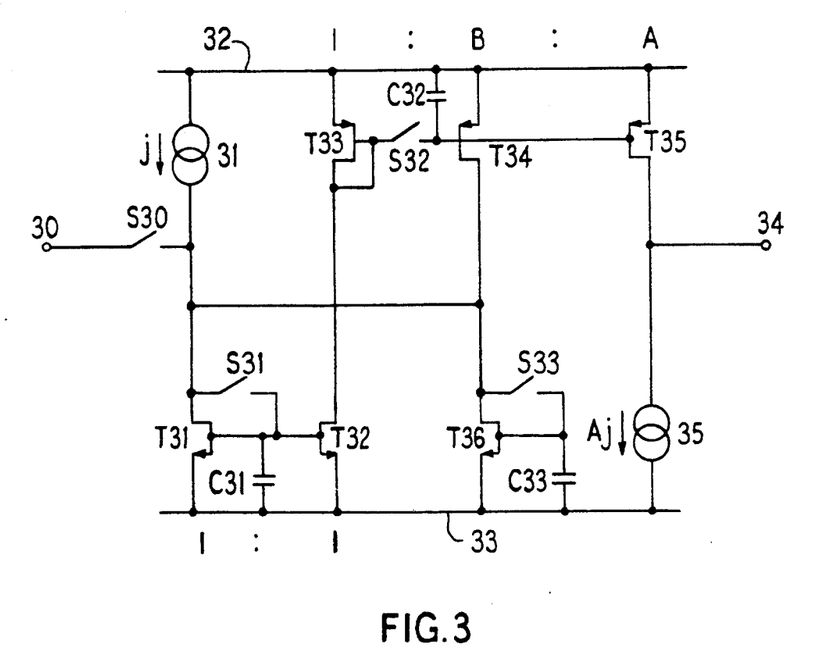
FIG. 3 is a circuit diagram of a first embodiment of an integrator circuit according to the invention.

FIG. 3 shows a first embodiment of an integrator circuit according to the invention which comprises an input 30 which is connected via a switch S30 to the junction of a current source 31 and the drain electrode of an n-channel field effect transistor T31. The other end of the current source 31 is connected to a positive supply rail 32 while the source electrode of transistor T31 is connected to a negative supply rail 33. The drain electrode of transistor T31 is connected via a switch S31 to its gate electrode, to one end of a capacitor C31 whose other end is connected to the negative supply rail 33, and to the gate electrode of an n-channel field effect transistor T32. The drain electrode of transistor T32 is connected to the drain electrode of a p-channel field effect transistor T33 whose source electrode is connected to the positive supply rail 32. The drain electrode of transistor T33 is connected to its gate electrode and to one side of a switch S32 whose other side is connected to the junction of a capacitor C32 and the gate electrodes of two further p-channel field effect transistors T34 and T35. The source electrodes of transistors T34 and T35 and the other end of the capacitor C32 are all connected to the positive supply rail 32. The drain electrode of transistor T34 is connected to the drain electrode of transistor T31 and to the drain electrode of an n-channel field effect transistor T36. The drain electrode of transistor T36 is connected via a switch S33 to its gate electrode and to one end of a capacitor C33. The source electrodes of transistors T32 and T36 and the other end of the capacitor C33 are connected to the negative supply rail 33. The drain electrode of transistor T35 is connected to an output terminal 34 and via a current source 35 to the negative supply rail 33. The capacitors C31, C32, and C33 may be formed by the gate/source capacitance of transistors T32, T34, and T36, respectively or may be additional capacitors. The current source 31 is arranged to provide a current j while the current source 35 is arranged to provide a current A.j. Switches S30 and S31 are closed during the portion $\phi$ of each sampling period and the switches S32 and S33 are closed during the portion $\bar{\phi}$ of each sampling period (see FIG. 2).

The operation of the integrator circuit is as follows. During the $\phi$ period of sampling period (n−1) a current i(n−1) is applied to input 30 and consequently a current $I_a(n-1)$ equal to $j+i(n-1)+i_f(n-1)$ is applied to the input of the first current memory cell formed by transistors T31 and T32, capacitor C31 and switch S31. At the end of the portion $\phi$ switches S30 and S31 open and transistor T31 becomes a current source passing the current $I_a(n-1)$ and transistor T32 also passes a current nominally equal to $I_a(n-1)$. During the portion $\bar{\phi}$ of sampling period n switches S32 and S33 are closed and transistor T34, which together with transistor T33, switch S32 and capacitor C32 forms a second current memory cell, conducts a current $I_b(n)$ which is nominally equal to $j+i(n-1)+i_f(n-1)$. However, in practice, the current $I_b$ is unlikely to be precisely equal to the current $I_a$ due to mismatches between transistors T31 and T32 and between transistors T33 and T34, and clock feedthrough effects of switches S31 and S32. Since both transistors T31 and T32 are acting as current sources the difference between the currents $I_a(n-1)$ and $I_b(n)$ plus the current j flows through transistor T36 as a current $I_c(n)=I_a(n-1)-I_b(n)+j$. Transistor T36 together with switch S33 and capacitor C33 acts as a third current memory cell which stores the error current $I_c(n)$. During portion $\phi$ of sampling period n the current i(n) is applied to input 30 and the feedback current $i_f(n)$ will be equal to $I_a(n-1)=I_b(n)-I_c(n)$. Thus the feedback current $i_f$ is very close to the required value and is not dependent on the matching between transistors T31 and T32 and between transistors T33 and T34. Also, the clock feedthrough effects due to switches S31 and S32 tend to cancel while those due to switches S1 and S2 in FIG. 1 accumulate. The accuracy of the feedback signal $i_f$ depends principally on the accuracy with which the current $I_c$ can be retained by transistor T36 and it should be noted that mismatches between the current sources 31 and 35 are not integrated since the bias current present in the output of the second current memory cell due to the effect of current source 31 is cancelled by the bias current component of the output of the third current memory cell which was derived from the current source 31. Thus, while mismatches between current sources 31 and 35 will cause an offset error, this error is not integrated as would be the case with the circuit of FIG. 1.

Figure 4:
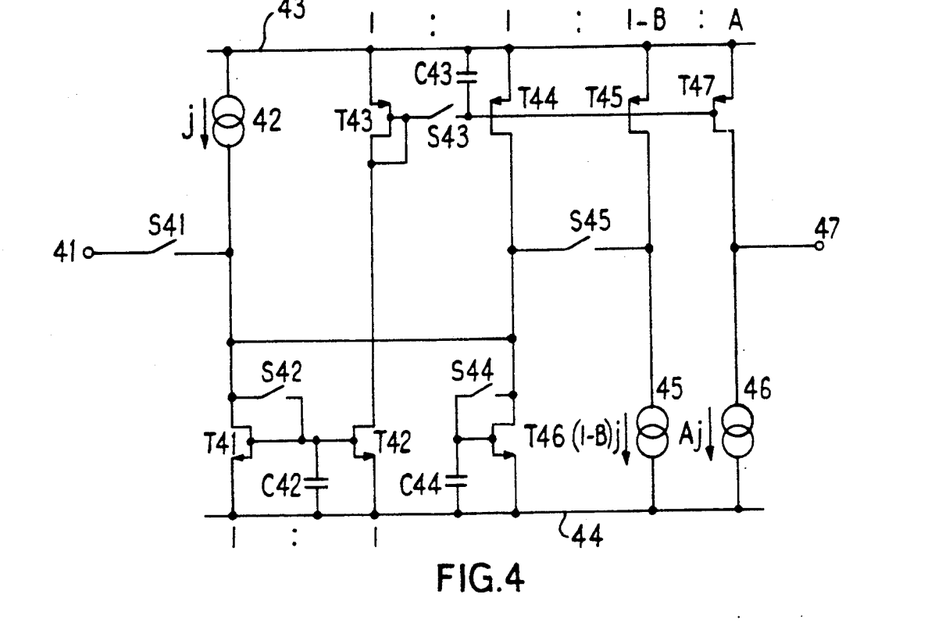
FIG. 4 is a circuit diagram of a second embodiment of an integrator circuit according to the invention.

FIG. 4 is a circuit diagram of a lossy integrator according to the invention. The integrator has an input 41 which is connected via a switch S41 to the junction of a current source 42 and the drain electrode of an n-channel field effect transistor T41. The other end of the current source 42 is connected to a positive supply rail 43 while the source electrode of transistor T41 is connected to a negative supply rail 44. The drain electrode of transistor T41 is connected via a switch S42 to its gate electrode and to the gate electrode of an n-channel field effect transistor T42. A capacitor C42 is connected between the gate electrode of transistor T42 and the negative supply rail 44. The drain electrode of transistor T42 is connected to the drain electrode of a p-channel field effect transistor T43 whose source electrode is connected to the positive supply rail 43. The drain electrode of transistor T43 is connected to its gate electrode and to one side of a switch S43 whose other side is connected to the gate electrodes of three further p-channel field effect transistors T44, T45, and T47. A capacitor C43 is connected between the gate electrode of transistor T44 and the positive supply rail 43. The drain electrode of transistor T44 is connected to the drain electrode of transistor T41 and to the drain electrode of an n-channel field effect transistor T46. The drain electrode of transistor T46 is connected to its gate electrode via a switch S44 while a capacitor C44 is connected between its gate and source electrodes. The source electrodes of transistors T42 and T46 are connected to the negative supply rail 44. The drain electrode of transistor T44 is connected via a switch S45 to the junction of the drain electrode of transistor T45 and a current source 45 whose other end is connected to the negative supply rail 44. The drain electrode of transistor T47 is connected to an output terminal 47 and via a current source 46 to the negative supply rail 44. The source electrodes of transistors T44, T45, and T47 are connected to the positive supply rail 43.

Transistors T41 and T42 are arranged to have the same gate width/length ratios so that a 1:1 current ratio exists between them. Similarly transistors T43 and T44 are arranged to have the same gate width/length ratio. However, the gate width/length ratio of transistor T45 is arranged to be $(1-B)$ times that of transistor T43 while that of transistor T47 is arranged to be A times that of transistor T43. The current source 42 is arranged to produce a current j, while current source 45 produces a current $(1-B)j$ and current source 46 produces a current Aj. Switches S41 and S42 are closed during portion $\phi$ of each sampling period while switches S43, S44, and S45 are closed during portion $\phi$ of each sampling period.

The principle of operation is similar to that of the ideal integrator described with reference to FIG. 3 except that during the $\phi$ portion of each sampling period an additional current $(1-B)$ is produced by transistor T45 and is passed by switch S45 to the input of the third current memory cell (transistor T46, switch S44, and capacitor C44). During the $\phi$ portion of a sampling period this current is inhibited as switch S45 is open and hence the feedback current becomes $B.i_f$. To create the current $B.i_f$ the correct matching between transistors T43 and T45 and the correct removal of the bias current $(1-B)j$ is relied upon. However, these errors now effect the factor $(1-B)$ which is normally significantly smaller than the factor B. The major problem with the approach shown in FIG. 1 arises when B is close to one.

The current sources 45 and 46 may be replaced by the output branches of a current mirror or current memory circuit whose input branch is formed by transistor T46. The transistors in the output branches would be dimensioned to give current ratios of 1:1-B:A. This has the advantage that mismatch errors between transistors T43, T45 and T47 which are not compensated by the described correction of the feedback signal are reduced as the error current in the transistor T46 is then mirrored through into the output branches.

Figure 5:
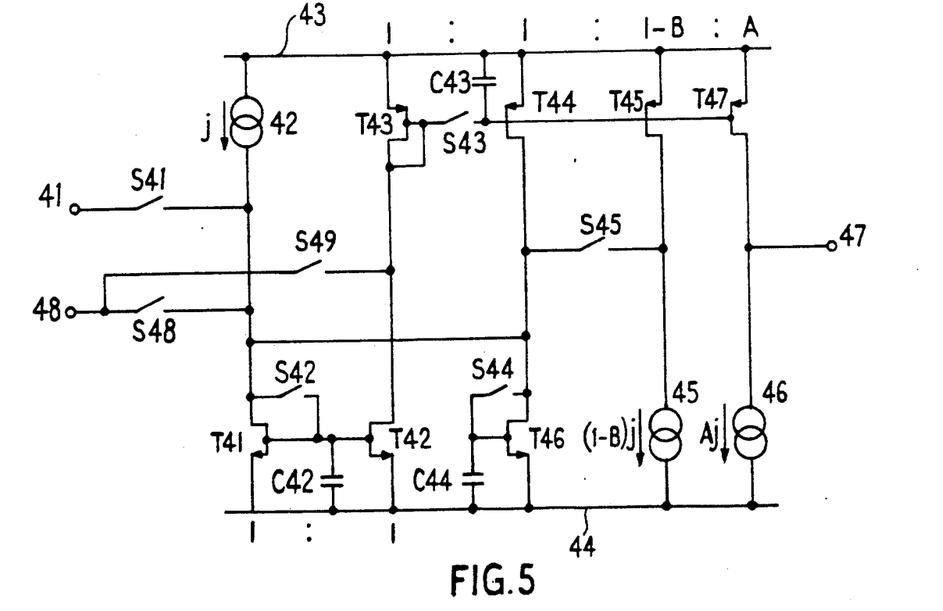
FIG. 5 is a circuit diagram of a third embodiment of an integrator circuit according to the invention.

FIG. 5 shows a first embodiment of a generalised lossy integrator according to the invention which is similar in form to that of the ideal integrator shown in FIG. 4 and in which the same references have been used for equivalent elements. The embodiment shown in FIG. 5 has an additional input 48 which is connected via a first switch S48 to the junction of the current source 42 and the drain electrode of transistor T41 and via a second switch S49 to the junction of the drain electrodes of transistors T42 and T43.

In operation a current i is applied to terminal 41 while a current-i is applied to terminal 48. Switch S41 is operated by a signal FE.$\phi$ (FE standing for Forward Euler) while switches S48 and S49 are operated by a signal BE.$\phi$ (BE standing for Backward Euler). When BE=-FE=1 a bilinear integrator is formed. During the portion $\phi$ of sampling period $(n-1)$ the current $I_a$ through transistor T41 is given by $$I_a = j - i(n-1) + i_f$$

$$\text{where } i_f = \frac{i_o(n-1)}{A} - \frac{(1-B) i_o(n-1)}{A}$$

$$= \frac{B i_o(n-1)}{A}$$

Therefore $I_a = j - i(n-1) + \frac{B}{A} i_o(n-1)$

During the portion $\phi$ of sampling period n the current $i_f$ is given by $$i_f = I_a - j - i(n) = i_o(n)/A.$$

Therefore $\frac{i_o(n)}{A} = j - i(n-1) + \frac{B}{A} i_o(n-1) - j - i(n)$ $$\frac{i_o(n)}{A} - \frac{B}{A} i_o(n-1) = -i(n) - i(n-1).$$

$$i_o(z)/A - \frac{B}{A} i_o(z)z^{-1} = -i(z) - i(z)z^{-1}$$

$$H(z) = \frac{i_o(z)}{i(z)} = -A \frac{(1 + z^{-1})}{1 - Bz^{-1}}$$

which is the expression for lossy bilinear integration.

The feedback signal $i_f$ and the output signal $i_o$ assume the correct value during the portion $\phi$ of each sampling period and remain so for the rest of the sampling period. Thus the output signal is valid for all but the settling time of the integrator circuit.

Figure 6:
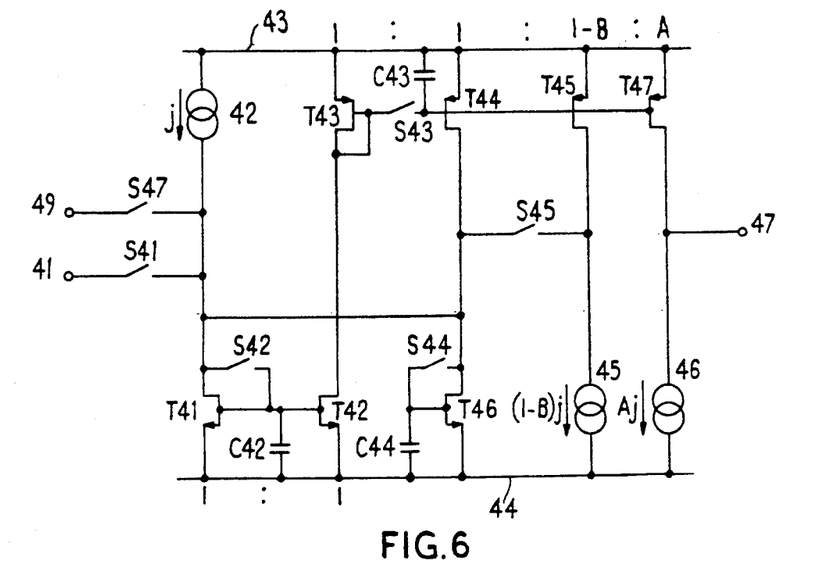
FIG. 6 is a circuit diagram of a fourth embodiment of an integrator circuit according to the invention.

FIG. 6 shows a second embodiment of a generalised lossy integrator according to the invention which is similar in form to that of the ideal integrator shown in FIG. 4 and in which the same reference labels have been used for equivalent elements. The embodiment shown in FIG. 6 has an additional input 49 which is connected via a switch S47 to the junction of the current source 42 and the drain electrode of transistor T41.

In operation a current i is applied to input 41 and a current i is applied to input 49. The switch S41 is closed by a signal FE.$\phi$ while the switch S47 is closed by a signal BE.$\phi$. When BE=FE=1 a bilinear integrator is formed. The operation as a bilinear integrator is as follows. During a portion $\phi$ of a sampling period $(n-1)$ the output current $i_o(n)$ is given by $$i_o(n) = A(I_a - j)$$

where $I_a$ is the current through transistor T41. Also $$i_f(n-1) = \frac{i_o}{A}(n-1) - i(n-1).$$

During portion $\phi$ of sampling period n the feedback current $i_f(n)$ is given by $$i_f(n) = i_f(n-1) - \frac{1-B}{A} \cdot i_o(n-1)$$

$$= \frac{B}{A} i_o(n-1) - i(n-1).$$

and the current $I_a(n)$ through transistor T41 is given by $$I_a(n) = j - i(n) + i_f(n)$$

$$= j - i(n) + \frac{B}{A} i_o(n-1) - i(n-1).$$

During portion $\phi$ of sampling period n the output current $i_o(n)$ is given by $$i_o(n) = A(I_a(n) - j)$$

$$= A\left(-i(n) + \frac{B}{A} i_o(n-1) - i(n-1)\right)$$

$$i_o(n) - B i_o(n-1) = -A (i(n) - i(n-1))$$

Converting to z domain $$i_o(z)(1 - Bz^{-1}) = -A \, i(z)(1 + z^{-1}).$$

$$H(z) = \frac{i_o(z)}{i(z)} = -A \cdot \frac{1 + z^{-1}}{1 - Bz^{-1}}$$

which is the expression for a lossy bilinear integrator.

In this case the output signal $i_o$ is not valid until the $\phi$ portion of each sampling period but only a single differential input is required.

Figure 7:
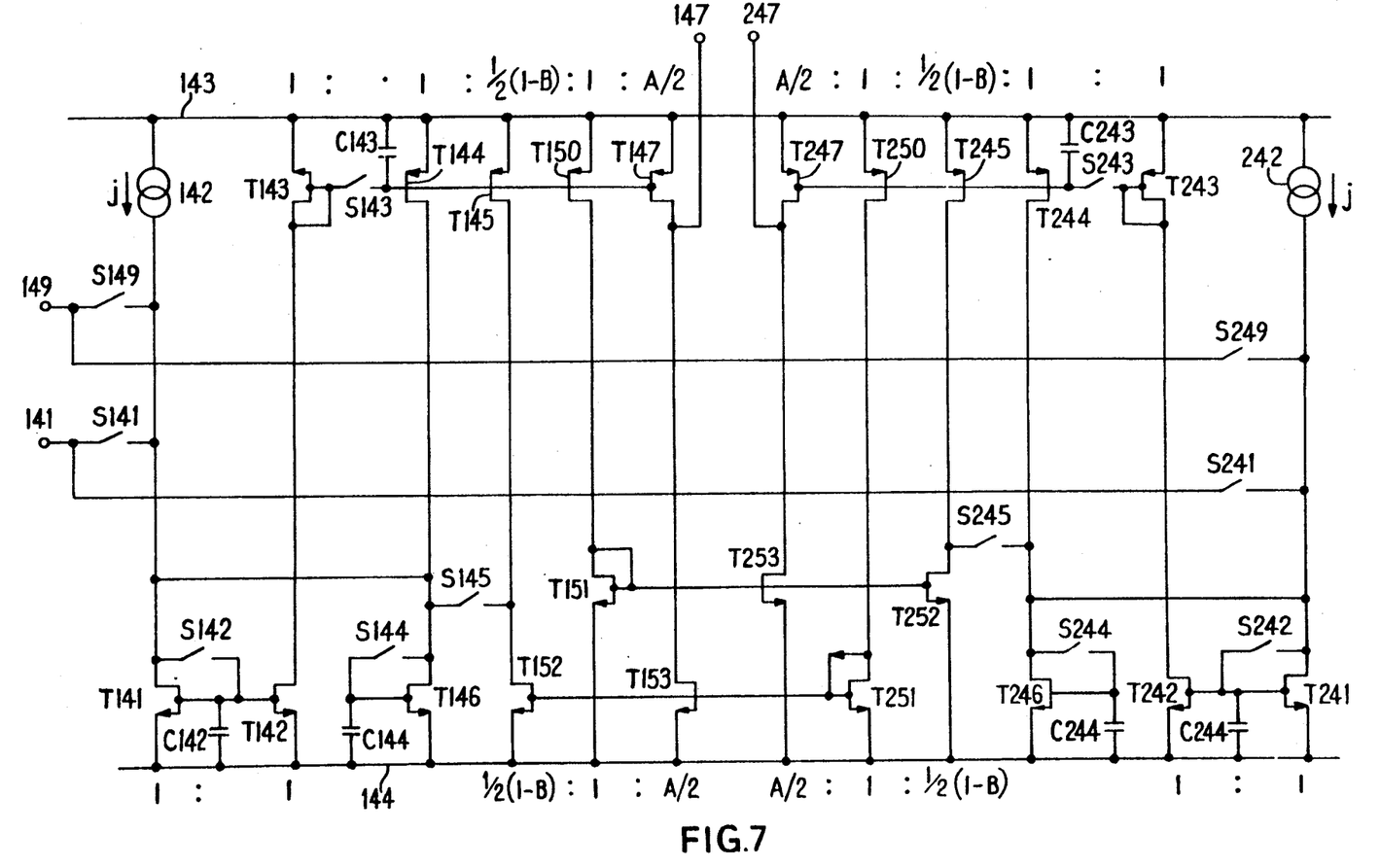
FIG. 7 is a circuit diagram of a fifth embodiment of an integrator circuit according to the invention.

FIG. 7 shows a fully balanced lossy bilinear integrator using two interconnected integrators as described with reference to FIG. 6. The integrator has a first input 141 which is connected to the junction of a current source 142 whose other end is connected to a positive supply rail 143 and the drain electrode of an n-channel field effect transistor T141 via a switch S141 and to the junction of a current source 242 whose other end is connected to the positive supply rail 143 and the drain electrode of an n-channel field effect transistor T241 via a switch S241. A second input 149 is connected via a switch S149 to the junction of the current source 142 and the drain electrode of transistor T141 and via a switch 249 to the junction of current source 242 and the drain electrode of transistor T241. The drain electrode of transistor T141 is connected via a switch S142 to its gate electrode and to the gate electrode of an n-channel field effect transistor T142. A capacitor C142 is connected between the gate and source electrodes of transistor T142. The drain electrode of transistor T142 is connected to the drain and gate electrodes of a p-channel field effect transistor T143 and to one side of a switch S143 whose other side is connected to the gate electrodes of four further p-channel field effect transistors T144, T145, T147, and T150. A capacitor C143 is connected between the gate and source electrodes of transistor T144. The drain electrode of transistor T144 is connected to the drain electrode of transistor T141, to the drain electrode of an n-channel field effect transistor T146, and to one side of a switch S144 whose other side is connected to the gate electrode of transistor T146. A capacitor C144 is connected between the gate and source electrodes of transistor T146.

The drain electrode of transistor T145 is connected to the drain electrode of an n-channel field effect transistor T152 and via a switch S145 to the drain electrode of transistor T146. The drain electrode of transistor T150 is connected to the drain and gate electrodes of an n-channel field effect transistor T151 while the drain electrode of transistor T147 is connected to an output terminal 147 and to the drain electrode of a n-channel field effect transistor 153. The source electrodes of transistors T141, T142, T146, T152, T151, and T153 are connected to a negative supply rail 144 while the source electrodes of transistors T143, T144, T145, T150, and T147 are connected to the positive supply rail 143.

The drain electrode of transistor T241 is connected via a switch S242 to its gate electrode and to the gate electrode of an n-channel field effect transistor T242. A capacitor C242 is connected between the gate and source electrode of transistor T242. The drain electrode of transistor T242 is connected to the drain and gate electrodes of a p-channel field effect transistor T243 and via a switch S243 to the gate electrode of four p-channel field effect transistors T244, T245, T250, and T247. A capacitor C243 is connected between the gate and source electrodes of transistor T244. The drain electrode of transistor T244 is connected to the drain electrode of transistor T246 and T241. A switch S244 is connected between the gate and drain electrodes of transistor T246 while a capacitor C244 is connected between its gate and source electrodes. The drain electrode of transistor T245 is connected to the drain electrode of an n-channel field effect transistor T252 and via a switch S245 to the drain electrode of transistor T246. The drain electrode of transistor T250 is connected to the drain and gate electrodes of an n-channel field effect transistor T251 while the drain electrode of transistor T247 is connected to an output 247 and to the drain electrode of an n-channel field effect transistor T253. The gate electrodes of transistors T151, T252, and T253 are connected together as are the gate electrodes of transistors T152, T153, and T251. The source electrodes of transistors T243, T244, T245, T250, and T247 are connected to the positive supply rail 143 while the source electrodes of transistors T241, T242, T246, T252, T251, and T253 are connected to the negative supply rail 144.

Transistors T141 and T142, switch S142, and capacitor C142 form a first current memory cell having a current ratio of 1:1; transistors T143, T144, T145, T150, and T147, switch S143 and capacitor C143 form a second current memory cell having current ratios 1:1(1−B)/2:1:A/2; transistors T241 and T242, switch S242, and capacitor C242 form a fourth current memory cell having a current ratio of 1:1; and transistors T243, T244, T245, T250, and T247, switch S243, and capacitor C243 form a fifth current memory cell having current ratios 1:1:(1−B)/2:1:A/2. Transistor T146, switch S144, and capacitor C144 form a third current memory cell while transistor T246, switch 244, and capacitor C244 form a sixth current memory cell. Transistors T151, T253, and T252 form a first current mirror circuit having current ratios 1:A/2:(1−B)/2 while transistors T251, T153, and T152 form a second current mirror circuit having current ratios 1:A/2:(1−B)/2. As before the current sources 142 and 242 both supply the current j.

It will be readily apparent to the person skilled in the art that the integrator shown in FIG. 7 is effectively two of the integrators shown in FIG. 6 interconnected to receive and produce differential currents, thus minimising common mode distortions. The current sources 45 and 46 of FIG. 6 are replaced by appropriate output branches of the first and second current mirror circuits. An analysis of the operation of this circuit can be carried out in a similar manner to that given with reference to FIG. 6.

Figure 8:
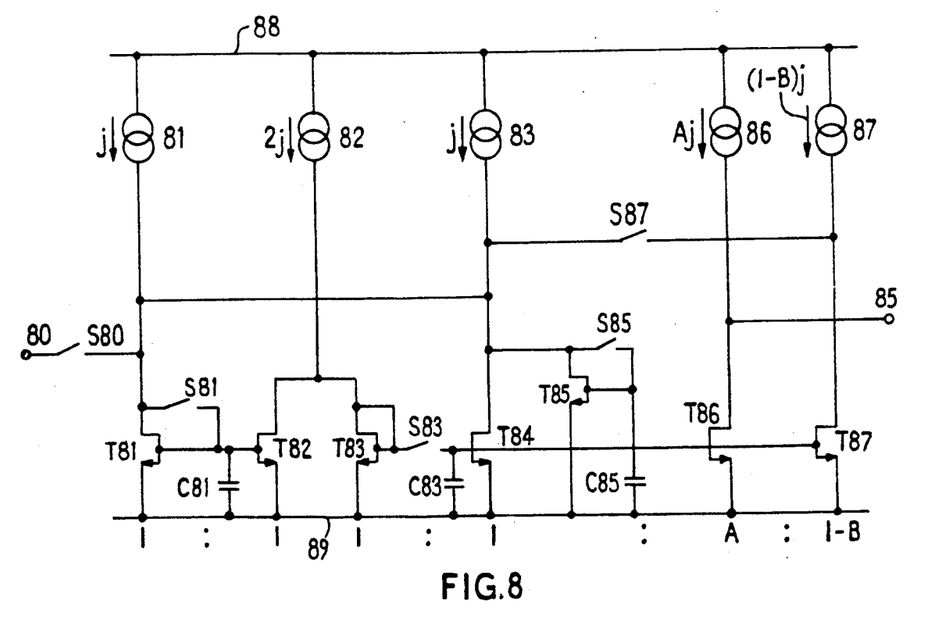
FIG. 8 is a circuit diagram of a sixth embodiment of an integrator circuit according to the invention.

FIG. 8 shows an embodiment of an integrator circuit in which signal currents pass only through n-channel field effect transistors. The integrator shown uses a forward Euler transform but backward Euler and bilinear integrators could be constructed by appropriate modification of this circuit, as would be apparent to persons skilled in the art. The integrator shown in FIG. 8 has an input 80 which is connected via a switch S80 to the junction of a current source 81 whose other end is connected to a positive supply rail 88 and the drain electrode of an n-channel field effect transistor T81. A switch S81 is connected between the drain electrode of transistor T81 and its gate electrode and the gate electrode of a further n-channel field effect transistor T82. A capacitor C81 is connected between the gate and source electrodes of transistor T82. The drain electrode of transistor T82 is connected to the positive supply rail 88 via a current source 82 and to the drain and gate electrodes of an n-channel field effect transistor T83. The gate electrode of transistor T83 is connected to the gate electrode of an n-channel field effect transistor T84 via a switch S83. A capacitor C83 is connected between the gate and source electrodes of transistor T84. The drain electrode of transistor T84 is connected to the drain electrode of transistor T81, to the positive supply rail via a current source 83, and to the drain electrode of an n-channel field effect transistor T85. A switch S85 is connected between the drain and gate electrodes of transistor T85 while a capacitor C85 is connected between its gate and source electrodes. The gate electrode of transistor T84 is connected to the gate electrodes of two further n-channel field effect transistors T86 and T87 whose drain electrodes are connected to the positive supply rail 88 via current sources 86 and 87, respectively. The drain electrode of transistor T86 is connected to an output terminal 85 while the drain electrode of transistor T87 is connected via a switch S87 to the drain electrode of transistor T84. The source electrodes of transistors T81 to T87 are connected to a negative supply rail 89.

The current sources 81 and 83 provide a current j, the current source 82 provides a current 2j, the current source 86 provides a current A.j and the current source 87 provides a current (1−B)j. The switches S80 and S81 are closed during the portion $\phi$ of each sampling period while the switches S83, S85, and S87 are closed during the portion $\phi$ of each sampling period. The first current memory cell comprising transistors T81 and T82, switch S81, and capacitor C81 has a 1:1 current ratio. The current ratios of the second current memory cell which comprises transistors T83, T84, T86, and T87, switch S83, and capacitor C83 are 1:1:A:(1−B). The third current memory cell comprises transistor T85, switch S85 and capacitor C85.

The operation of the circuit will first be explained on the assumption that it operates as an ideal integrator i.e. that switch S87, current source 87, and transistor T87 are omitted.

During a portion $\phi$ of the sampling period (n−1) the current I₁ through transistor T81 is given by $$I_1 = i(n-1) - i_f + j$$

where $i(n-1)$ is the input current in sampling period $(n-1)$

During the portion $\phi$ of sampling period n the current I₂ through transistor T83 is given by $$I_2 = 2j - I_1 = I_3 = \frac{i_o(n) + Aj}{A}$$

where I₃ is the current through transistor T84

$$i_o(n)/A + j = 2j - [i(n-1) - i_o(n-1)/A + j].$$

$$i_o(n) = -Ai(n-1) + i_o(n-1)$$

Converting to the z domain $$i_o(z) - i_o(z)z^{-1} = -A\, i(z)z^{-1}$$

$$H(z) = \frac{i(z)}{i_o(z)} = -A\frac{z^{-1}}{1-z^{-1}}$$

This is the expression for a forward Euler integrator.

If we now consider the effect of the third current memory cell it can be seen that during the portion $\phi$ of each sampling period transistor T81 is a current source producing the current $i(n-1) + i_f + j$. Any mismatches between devices which would cause the current $i_f$ to be in error will be compensated for by the third current memory cell as the error current will flow into transistor T85 and when switch S85 opens at the end of the portion $\phi$, the error current will be subtracted from the feedback current.

Clearly backward Euler and bilinear integrators could be constructed using this technique and a lossy integrator is formed by subtracting $(1-B)(I_3-j)$ so that $B(I_3-j)$ is fed back. This is achieved by means of the switch S87, transistor T87, and current source 87 which causes the current $(1-B)(I_3-j)$ to be subtracted from that stored in the third current memory cell during the $\phi$ portion of the sampling period and consequently during the $\phi$ portion the current $B(I_3-j)$ is fed back. Also a fully differential form of all of these integrators can be constructed in a manner which will be readily apparent to persons skilled in the art. For an example of a fully differential bilinear integrator reference should be made to our co-pending U.K. application No. 8828667.9 (PHB33514), the contents of which are hereby incorporated by reference. Clearly an all p-channel rather than all n-channel embodiment could be constructed which would be of substantially the same form but with the polarities reversed.

It should be noted that the current memory cells and current mirror circuits shown have been disclosed in their simplest basic form. If an improved performance is required a number of enhancements can be employed. This includes using cascoded current mirrors or current memories, using source degeneration resistors, using dynamic element matching, and using current conveyors or current conveyor type current memory cells, particularly where current summing occurs at an input. These techniques are disclosed in one or more of the co-pending U.K. applications Nos. 8721758 (PHB33385), 8721759 (PHB33386), 8729987 (PHB33426), 8815668.2 (PHB33477), 8828666.1 (PHB33512), 8828668.7 (PHB33513), 8828667.9 (PHB33514), 8903705.5 (PHB33532), and 8903704.8 (PHB33533), the contents of which are hereby incorporated by reference. It should be noted that U.S. Pat. No. 4,864,217 (9/5/89) corresponds to PHB 33,385; U.S. Pat. No. 4,866,368 (9/12/89) to PHB 33,386; U.S. Pat. No. 4,897,596 (1/30/90) to PHB 33,426; U.S. Pat. No. 4,958,123 (9/18/90) to PHB 33,477; U.S. Ser. No. 446,518 (filed 12/4/89) to PHB 33,512; U.S. Ser. No. 441,140 (filed 11/22/89) to PHB 33,513; U.S. Ser. No. 479,304 (filed 2/13/90) to PHB 33,532; and U.S. Ser. No. 479,502 (filed 2/13/90) to PHB 33,533.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that I intend to include within the scope of the invention the novel features, or any novel combination of features, disclosed herein explicitly or implicitly or any modifications of one or more of those features which would be obvious to persons skilled in the art, whether or not they relate to the same invention as presently claimed in any claim, and whether or not they mitigate any or all of the same technical problems as does the present invention.

I claim:

1. An integrator circuit for integrating an input signal in the form of a sampled analog current comprising:
   input means for receiving the input signal,
   output means for supplying an output signal corresponding to an integrated input signal,
   a current memory for producing at its output during a first portion of a sampling period a current related to a current applied to its input during a second portion of that or a preceding sample period,
   means for coupling the output means to an output of the current memory,
   means for supplying a feedback current from an output of the current memory to the input of the current memory,
   means for determining the feedback current, said determining means including means for determining, during the first portion of the sampling period, a difference current between the feedback current and the current applied to the input of the current memory during the second portion of that or a preceding sample period, and means for modifying the feedback current in accordance with the difference current, and
   means for applying the modified feedback current to the input of the current memory during the second portion of the sample period.

2. An integrator circuit as claimed in claim 1 wherein the determining means comprises means for producing a current at the input of the current memory during the first portion of each sampling period which is equal to the current applied to the input of the current memory during the second portion of that or a preceding sampling period.

3. An integrator circuit as claimed in claim 2 further comprising, means for adding a bias current to the input signal current and means for subtracting a suitably scaled bias current from the feedback current and the output signals so that bi-directional input currents can be integrated and bi-directional output currents produced.

4. An integrator circuit as claimed in claim 3 wherein signal currents are conducted only by field effect transistors of one polarity.

5. An integrator circuit as claimed in claim 4 wherein signal currents are conducted only by n-channel field effect transistors.

6. An integrator circuit as claimed in claim 1 wherein the current memory comprises first and second current memory cells each having an input and an output, means coupling the output of the first current memory cell to the input of the second current memory cell and the output of the second current memory cell to the input of the first current memory cell.

7. An integrator circuit as claimed in claim 6 wherein the first current memory cell comprises a field effect transistor having a switch connected between its drain and gate electrodes, the switch being closed only during the second portion of a sampling period.

8. An integrator circuit as claimed in claim 7 wherein an additional capacitor is connected between gate and source electrodes of the transistor.

9. An integrator circuit as claimed in claim 7 wherein the means for applying the modified feedback current comprises means for coupling the output of the second current memory cell to the input of the first current memory cell during the second portion of a sampling period.

10. An integrator circuit as claimed in claim 9 wherein an input of a third current memory cell is coupled to the input of the first current memory cell, the third current memory cell receiving, during the first portion of each sampling period a difference current between the current produced at the input of the first current memory cell and a current produced at the output of the second current memory cell, and supplying that current to the input of the first current memory cell during the second portion of each sampling period.

11. An integrator circuit as claimed in claim 10 wherein the second current memory cell has a further output which supplies a scaled version of the current at the first output of the second current memory cell during the first portion of each sampling period and applies said scaled current to the input of the third current memory cell.

12. An integrator circuit as claimed in claim 6 wherein the means for applying the modified feedback current comprises means for coupling the output of the second current memory cell to the input of the first current memory cell during the second portion of a sampling period.

13. An integrator circuit as claimed in claim 6 wherein an input of a third current memory cell is coupled to the input of the first current memory cell, the third current memory cell receiving during the first portion of a sampling period a difference current between the current produced at the input of the first current memory cell and a current produced at the output of the second current memory cell, and supplying that current to the input of the first current memory cell during the second portion of each sampling period.

14. An integrator circuit as claimed in claim 13 wherein the second current memory cell has a further output which supplies a scaled version of the current at the first output of the second current memory cell during the first portion of a sampling period and applies the scaled current to the input of the third current memory cell.

15. An integrator circuit as claimed in claim 6 further comprising, means for adding a bias current to the input signal current and means for substracting a suitably scaled bias current from the feedback current and output signal so that bi-directional input currents can be integrated and bi-directional output currents produced.

16. An integrator circuit as claimed in claim 6 wherein the second current memory cell has a second output and said second output is coupled to the output means.

17. An integrator circuit as claimed in claim 6 wherein the input means is coupled to the input of the first current memory cell.

18. An integrator circuit as claimed in claim 6 wherein the input means is coupled to the input of the second current memory cell.

19. An integrator circuit as claimed in claim 6 wherein a difference in current between the feedback current and a current applied to the input of the first current memory cell is applied to an input of a third current memory cell during the first portion of a sampling period and the modifying means comprises means for adding a current stored in the third current memory cell to a current produced at the output of the second current memory cell during the first portion of the sampling period.

20. An integrator circuit as claimed in claim 19 wherein the second current memory cell comprises a further output for supplying a scaled output current equal to a constant times the current supplied by the first output of the second current memory cell, and means for applying the scaled current in addition to the feedback current to the input of the first current memory cell during the second portion of the sampling period.

21. An integrator circuit as claimed in claim 20 wherein the means for applying the scaled current to the input of the first current memory cell comprises means for applying the scaled current to the input of the third current memory cell during the first portion of the sampling period.

22. An integrator circuit as claimed in claim 21 wherein the third current memory cell comprises a field effect transistor having a switch connected between its drain and gate electrodes, the switch being closed only during the first portion of a sampling period.

23. An integrator circuit as claimed in claim 19 wherein the third current memory cell comprises a field effect transistor having a switch connected between its drain and gate electrodes, the switch being closed only during the first portion of a sampling period.

24. An integrator circuit as claimed in claim 1 wherein signal currents are conducted only by field effect transistors of one polarity.

* * * * *

UNITED STATES PATENT AND TRADEMARK OFFICE
CERTIFICATE OF CORRECTION

PATENT NO. : 5,023,489
DATED : June 11, 1991
INVENTOR(S) : IAN C. MACBETH

It is certified that error appears in the above-identified patent and that said Letters Patent is hereby corrected as shown below:

```
     line  3, after ")" insert --,-- (comma);

line  7, change "φ" to --φ̄--;

line 12, change "φ" to --φ̄--;

line 16, change "φ" to --φ̄--.

Column 2, line 18, change "φ" to --φ̄--;

line 22, change "φ" to --φ̄--; after "part" insert
                   --of--;

Column 6, line 12, change "φ" to --φ̄--;

line 16, change "φ" to --φ̄--;

line 21, change "φ" to --φ̄--;

line 40, change "φ" to --φ̄--;

Column 7, line 42, change "φ" to --φ̄--;

line 51, change "φ" to --φ̄--;

Column 8, line 15, change "φ" to --φ̄--;
```

UNITED STATES PATENT AND TRADEMARK OFFICE
CERTIFICATE OF CORRECTION

PATENT NO. : 5,023,489
DATED : June 11, 1991
INVENTOR(S) : IAN C. MACBETH

It is certified that error appears in the above-identified patent and that said Letters Patent is hereby corrected as shown below:

line 19, change "$\phi$" to --$\overline{\phi}$--;

line 64, change "$\phi$" to --$\overline{\phi}$--;

line 67, change "$\phi$" to --$\overline{\phi}$--;

Column 9, line 25, change "$\phi$" to --$\overline{\phi}$--;

line 43, change "$\phi$" to --$\overline{\phi}$--;

Column 11, line 62, change "$\phi$" to --$\overline{\phi}$--;

Column 12, line 8, change "$\phi$" to --$\overline{\phi}$--;

line 52, change "$\phi$" to --$\overline{\phi}$--.

Signed and Sealed this

Fourteenth Day of July, 1992

Attest:

DOUGLAS B. COMER

*Attesting Officer*      *Acting Commissioner of Patents and Trademarks*